March 8, 1966 R. W. ALDRICH ET AL 3,239,728

SEMICONDUCTOR SWITCH

Filed July 17, 1962 2 Sheets-Sheet 1

INVENTORS:
NICK HOLONYAK, JR.
RICHARD W. ALDRICH,

BY Urban H. Faubion

THEIR ATTORNEY.

INVENTORS:
NICK HOLONYAK, JR.
RICHARD W. ALDRICH,
BY Urban H. Faubion
THEIR ATTORNEY.

United States Patent Office 3,239,728

Patented Mar. 8, 1966

3,239,728
SEMICONDUCTOR SWITCH

Richard W. Aldrich, Liverpool, and Nick Holonyak, Jr., Syracuse, N.Y., assignors to General Electric Company, a corporation of New York Filed July 17, 1962, Ser. No. 210,364
10 Claims. (Cl. 317—235)

This invention relates to semiconductor switches of the type which can be switched between two states of impedance, i.e., between a high impedance and a low impedance. In particular the invention relates to such switches which can be changed from a state of low impedance to a state of high impedance and from a state of high impedance to a state of low impedance. Stated in another way, the invention relates to such semiconductor switches which can be changed from a highly conductive state to a much less conductive state (turned off) and also switched from the essentially non-conductive state to the highly conductive state (turned on).

Semiconductor switches have become an important component in a wide variety of control applications, particularly PNPN three terminal devices of the type frequently referred to as silicon controlled rectifiers. Operation of such devices is described in Chapter 1 of the General Electric Controlled Rectifier Manual, second edition, copyright 1961 by the General Electric Company, the article by Moll, Tanenbaum, Goldey and Holonyak in Proceedings of the IRE, September 1956, vol. 44, pp. 1174 to 1182, and in the co-pending patent application, S.N. 838,504, entitled Semiconductor Devices and Methods of Making Same, filed Sept. 8, 1959 in the name of the present inventors and assigned to the assignee of the present application. The semiconductor switch is made an active element in the circuit by connecting two of its three terminals (its anode and cathode terminals) in the circuit to be controlled. With the switch in its "off" condition the rectifier acts as a high impedance element. Except for a very small leakage current, the switch acts as an open circuit. When the switch is in its "on" condition, it is a very low impedance device.

The usual mechanism for rendering the device conductive is to introduce current into a third lead or terminal (called the gate lead) which increases the current flowing through the device and thereby renders the device conductive. This action is descriptively referred to as triggering the device or turning it on. When the device is triggered into the high conduction mode, the gate lead has very little control over the device and the only method of turning the device off is to reduce the current between the device anode and cathode (the main conduction path) below a given level called the holding current level.

These devices have been made extremely sensitive to triggering (turn on) injection current at the gate terminal. That is, they have been made so that an extremely small gate injection current can be used to change the device from its high impedance state to its high conduction mode. However, it has been extremely difficult to switch the device from its high conduction mode to the low conduction mode of operation utilizing current removal at the gate lead. It may readily be seen how useful a device would be if it could be turned off with a turn off pulse at the gate and the present invention provides such a device.

To understand the gate turn off mechanism, it is necessary to understand a few of the operating principles and characteristics of 4 layer, 3 terminal switching elements. The operation of these devices is generally well understood. However, certain aspects of the operation of these devices is so crucial to an understanding of the present invention that a somewhat simplified physical description of the operation is given here.

The heart of the switch is generally a pellet of monocrystalline semi-conductor material such as silicon which has four layers of alternate conductivity type, i.e., 4 layers which alternately have an excess of positive holes (p-type material) and an excess of negative electrons (n-type material) with a barrier or junction between the layers. Thus the device is called a PNPN or NPNP semiconductor device to describe the four layers of alternate conduction types. One of the easiest ways to understand the operating principles is to consider a 4 layer PNPN device (see FIGURE 1*a*) to consist of a PNP and an NPN transistor (FIGURES 1*b* and 1*c* respectively) with the center junction, $J_c$ and the two center layers common to both transistors.

It is generally recognized that a semiconductor device consisting of two layers of different conductivity types (i.e., a PN device) readily conducts current in one direction but blocks current in the opposite direction. For example, if a voltage is applied across such a PN device which is positive at the P type layer and negative at the N type layer, the device readily conducts current whereas the device blocks current flowing when the reverse voltage is applied. Simply stated, the reason the device readily conducts when a voltage is applied across it which is positive at the P type layer is that the positive voltage repels P type carriers at one end of the device and the negative voltage repels the negative electrons at the other end. Thus the P and N type conduction carriers are moved toward and across the junction. With the opposite polarity applied, i.e., the junction reverse biased, the holes and electrons are attracted away from the junction. This forms a depletion region at the junction which is relatively free of both P and N type carriers. A charge appears across the depletion region (and junction), much as in a common capacitor, which opposes current flow. This condition can be broken down and current forced through the device by raising the reverse voltage to a sufficiently high value. As long as this current flow is maintained, the junction is said to be saturated.

Now consider the PNPN device with a positive potential at the P type end layer and a negative potential at the N type end layer in the light of this discussion. It is seen that the junctions between the two outer end layers (at both ends) tend to conduct whereas the center junction, $J_c$, between the NP type layers tends to block current flow through the device. In other words, each of our two conceptual transistors which make up the PNPN device has one junction which tends to block current flow through the device. Like the PN device discussed above, the PNPN device can be made to conduct by raising the voltage across it to some value which forces conduction across the center junction $J_c$. It may also be made to conduct by introducing the proper amount of current through a gate lead on one of the intermediate layers to cause a change of the charge condition across the center junction $J_c$.

The total current flowing in the PNPN structure can be pictured as the sum of currents flowing in each of the individual conceptual transistor sections. Current flow in each section depends upon having current supplied to its base by the other section. That is to say that conduction of the PNP section depends on electron current from the end N layer to its base (the internal P type layer) and conduction of the NPN section depends upon flow of hole current from the end P layer to its base (the internal N type layer). Without these currents the proper charge cannot be maintained across the center junction $J_c$ to support current flow.

Conditions for the device to be conducting can be stated in terms of the current gain of the individual sections. In fact, the concept of current gain $\alpha$ in each of the transistor sections (i.e., in each part of the total PNPN structure) is so fundamental to an understanding of turn off gain that a digression is made here to explain this concept. The current gain $\alpha$ is defined as the fraction of current injected at the emitter of each of the transistors which reaches the collector of that transistor. In other words, in the conceptual PNP transistor the current gain $\alpha_{pnp}$ defines the fraction of the current through the emitter (the end P type layer which has the positive voltage applied to it) which reaches the collector (i.e., the internal P type layer which is negatively biased). Thus $\alpha_{pnp}$ is defined by the ratio of the collector current to the emitter current and in this particular transistor section the predominant current flow is hole current. The current gain of the NPN conceptual transistor section, $\alpha_{npn}$ defines the fraction of current through the emitter (the end N type layer which is biased negatively) that reaches the collector (the internal N type region which is positively biased).

The total current of the device is equal to the sum of the hole current from the end P region, the electron current from the end N region and a small leakage current. It is known that the device is highly conductive (on) when the sum of the current gains ($\alpha s$) of the two transistor sections is nearly unity and off or non-conductive when the sum of the current gains in the two transistor sections is less than unity, e.g., 0.9. The current gains ($\alpha_{pnp}$ and $\alpha_{npn}$) increase as the collector to emitter voltage is increased but only slightly until the device (the normally blocking junction $J_c$) breaks down and then appreciable current flows. The current gain then increases rapidly as the emitter current is increased.

The gate lead which may be connected to the internal P type conduction layer provides a very effective way of increasing the emitter current. That is to say that the emitter current is easily increased through transistor action by introducing current, $I_g$, at the gate lead. The mechanism for switching the device from its state of high impedance to its state of low impedance is well understood. As indicated above, it is also understood that the device may be switched from its on condition (its low impedance condition) to its off condition (its high impedance condition) by decreasing the current supplied to the base of either transistor section to such a low value that the center junction $J_c$ again becomes a blocking junction, i.e., unsaturated or reverse biased. This may be done by decreasing the voltage across the device until it can no longer support the necessary current flow.

Another mechanism for doing this is to extract current at the gate lead. This "drains" positive carriers from the internal P type base region which results in a field in the base that reduces the flow of negative carriers from the N type end region and effectively "starves" the junction $J_c$. The reduced flow of electrons across the junction $J_c$ into the internal region results in a field which also reduces the flow of positive holes from the end P type emitter region. If the withdrawn gate current is large enough, the center junction $J_c$ returns to its normally blocking condition. This effect takes place in a very short time, e.g., a few microseconds. This latter mode of operation is not used in most PNPN semiconductor switches because the current which must be withdrawn in order to turn the device off approaches the normal conduction current of the device.

For an understanding of the way a practical gate turn off switch is built, reference is again made to the conceptual pair of transistors. Assume that the gate lead is connected to the central P type layer of the NPN transistor (FIGURE 1*b*) and consider the situation where the device is conducting. A portion of the current through the device is supplied by the PNP transistor and the magnitude of this current is dependent upon its gain $\alpha_{pnp}$. If the PNP transistor section of the device supplies a current which is much greater than the current required to keep the "normally blocking center junction $J_c$" from becoming non-conductive, then it becomes very difficult to remove enough current at the gate lead to turn the device off. Actually, under these conditions the current withdrawn by the gate may not reach a sufficiently high value to turn the device off until it almost equals the device current itself. What this means is that the current gain of the PNP region should be reduced to the point that it supplies little if any more than just that current required to keep the center junction $J_c$ conductive when no gate current is flowing. The current gain for this conceptual transistor should approach zero.

It is well understood that the requirement for a device to turn on is that the sum of the current gains $$(\alpha_{pnp}+\alpha_{npn})$$

of the conceptual transistors approach unity. This means that if the current gain of the PNP section of the device approaches zero then the current gain of the NPN section of the device should approach unity. A very practical device results when the ratio of the current gain of the NPN transistor section to the current gain of the PNP section is about an order of magnitude or more. The turn off capability, defined here as the ratio of the current flowing through the total device just before it is switched off to the gate current which must be extracted in order to turn the device off, increases as the ratio of $\alpha s$ increases. For example, when the ratio of $\alpha s$ is about two orders of magnitude the device is exceedingly sensitive to turn off and if the ratio of $\alpha s$ is properly adjusted its turn off capability may be made to approach its turn on gain.

In carrying out the present invention a semiconductor switch of the character described is provided which can be turned off and turned on at a gate lead. The turn off feature is provided by depressing the current gain of one section of the device in such a manner that the sum of the current gains of the sections is held near unity.

The features which are believed to be characteristic of the invention are set forth with particularity in the appended claims. The invention itself, however, both as to its organization and advantages thereof may best be understood by reference to the following description taken in connection with the accompanying drawings in which:

FIGURE 1*a* is a schematic representation of a four layer, three terminal PNPN switch used in the description and analysis of the present invention (including the above description);

FIGURES 1*b* and 1*c* are conceptual PNP and NPN transistors constructed from the four layer device of FIGURE 1*a* which are analyzed individually and superimposed in the above explanation of the concepts of the present invention;

Figures 1A, 1B, 1C:
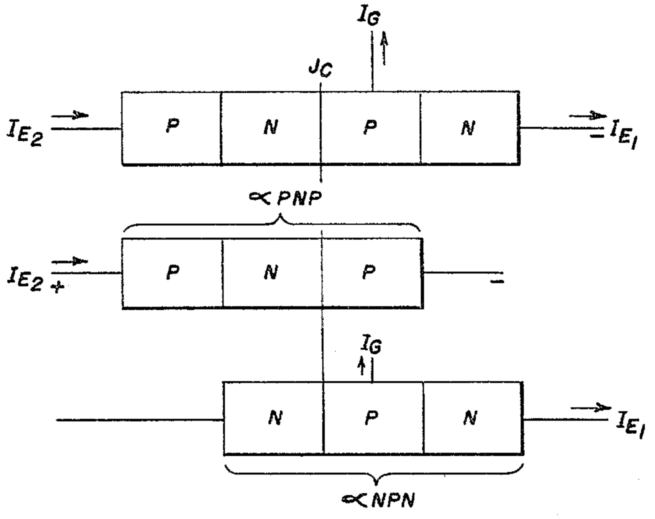

In order to obtain a better understanding of the invention a simple one dimensional analysis is given utilizing the typical four region PNPN structure schematically represented in FIGURE 1*a*. Before beginning the analysis, however, it should be recognized that a three terminal PNPN switch cannot be described accurately by a one dimensional model, except at very low current levels.

Even so, the analysis provides considerable insight into the problems involved in both turning on and turning off such switches.

As pointed out above, the four zone, three terminal PNPN switch illustrated in FIGURE 1*a* has contacts fixed to the two end regions and a gate lead attached to one of the base layers (the internal P region as illustrated). Assume an external voltage applied across the switch which is positive at the end P region and negative at the end N region. For this polarity the current flows through the device as indicated by the arrows from the external P type region to the external N type region. The current flowing into the external P type region is designated as $I_{E2}$, the current flowing out from the external N type region is designated as $I_{E1}$ and current flowing in the gate lead is designated as $I_g$. As above, the current gain for the PNP region is designated as $\alpha_{pnp}$ and the current gain for the NPN region is designated as $\alpha_{npn}$. If some leakage currents are neglected, the following equations can be written to describe the currents in the turned on device:

(1) $$I_{E2}\alpha_{pnp}-I_G=(1-\alpha_{npn})I_{E1}$$

(2) $$I_{E1}\alpha_{npn}=(1-\alpha_{pnp})I_{E2}$$

solving for $I_{E2}$ the following equation is obtained:

(3) $$I_{E2}=I_G\left(\frac{\alpha_{npn}}{\alpha_{npn}+\alpha_{pnp-1}}\right)$$

To determine the requirements for turning off the device, the device is considered to be in the conduction state with an external current to the load flowing which is determined principally by the magnitude of the external power supply voltage and the resistance of the load connected to the device. As was indicated previously, the center junction in the device, i.e., the junction between the internal N and P regions (labeled $J_c$) is a junction which normally opposes current flow in the direction indicated. When current is flowing, a voltage appears across the junction $J_c$ which is in a direction to maintain or sustain current flow through the junction. In other words, the junction voltage changes from its blocking direction in the non-conduction state to "forward bias" in its conducting state. Thus, it is apparent that the voltage across this junction varies. By this mechanism, the current in the device and the current gains ($\alpha s$) of the two sections of the device change. Once the device is conducting the change of the $\alpha s$ is in a direction to supply exactly enough base current for each transistor section to maintain the current flow. If the current is removed from one of the bases the load current drops unless the current gains ($\alpha s$) can readjust (increase) themselves.

For a given load current there is a maximum value possible for each of the $\alpha s$. As the outflow of gate current is increased, the $\alpha$ of the NPN section (the section having the gate lead attached to its base) decreases until ($\alpha_{npn}+\alpha_{pnp}$) is less than one. At this point the device switches to the off state.

To find the gate current $I_G$ required to turn off a given load current, $I_{E2}$, the $\alpha s$ are assumed to have their maximum values (for the currents $I_{E2}$ and $I_{E1}$). We assume that $I_{E2}$ has a minimum possible value $I_M$ with the gate current $I_G$ and $I_H$ is the holding current necessary to maintain the device in its on condition where $I_g=0$. We define turn off gain $\beta_{off}$ as a ratio of change in minimum hold current to the gate current $I_G$. The following equation defines turn off gain for the device:

(4) $$\beta_{off}=\frac{I_M-I_H}{I_G}=\frac{I_M}{I_G}\left(1-\frac{I_H}{I_M}\right)$$

Then substituting from Equation 3 above turn off gain (5) $$\beta_{off}=\left(\frac{\alpha_{npn}}{\alpha_{npn}+\alpha_{pnp-1}}\right)\left(1-\frac{I_H}{I_M}\right)$$

or if $I_M$ is much larger than $I_H$ (6) $$\beta_{off}\rightarrow\frac{\alpha_{npn}}{\alpha_{npn}+\alpha_{pnp-1}}(I_M>>I_H)$$

In general, the way that the $\alpha s$ vary as a function of current are unknown. Experiments indicate that it is possible to have both $\alpha s$ approach unity at moderate currents (as, for example as a result of fields developed by ohmic current flow). Under these conditions the turn off gain $\beta_{off}$ then also approaches unity. It is clear then that the turn off gain can be high if some means can be found to restrict one or both of the $\alpha s$.

Perhaps a better insight can be obtained into the means for restricting the current gains if it is recognized that the current gain $\alpha$ is basically composed of two parameters vis: $\gamma$ the emitter efficiency and $\beta$, the transport factor. $\alpha$ is simply the product of these two quantities, that is (7) $$\alpha=\gamma_\beta$$

Now $\gamma$ is principally determined by the relative impurity concentration of the two sides of the junctions and for not too high or too low injection levels is given by the following equation:

(8) $$\gamma=\frac{1}{1+\frac{\sigma BW_B}{\sigma EL_E}}$$

where $L_E$ is the diffusion length for minority carriers on the emitter side of the junction, $W_B$ is the base width, $\sigma B$ and $\sigma E$ are conductivities of the base and emitter regions respectively. The emitter efficiency is also affected by the lifetime of the material. In other words emitter efficiency can be controlled by controlling the lifetime of the material. The significance of these expressions is obtaining turn off gain can better be shown after the effect of the current gains $\alpha$ have been considered.

An inspection of the equation for the turn off gain (4) shows that the individual current gains $\alpha_{npn}$ and $\alpha_{pnp}$ should have a sum approaching unity for maximum turn off gain and that the turn off gain can be high if a means is found to restrict one or both of the individual current gains ($\alpha s$). Since the $\alpha_{npn}$ appears in the numerator it becomes apparent that maximum effect will be obtained if $\alpha_{pnp}$ is the one which is suppressed. A consideration of these equations also shows that in order for a PNPN or NPNP device to exhibit a switching characteristic (from high to low impedance) the current gain ($\alpha$) of at least one section of the device must increase with current. That is to say, that since the sum of the $\alpha s$ of the section must be greater than one to exhibit turn on gain and since the sum of the $\alpha s$ must be less than unity in order to have turn off gain it is apparent that at least one component transistor structure must have an $\alpha$ which varies with current if both turn on and turn off gain are to be exhibited.

Figure 2:
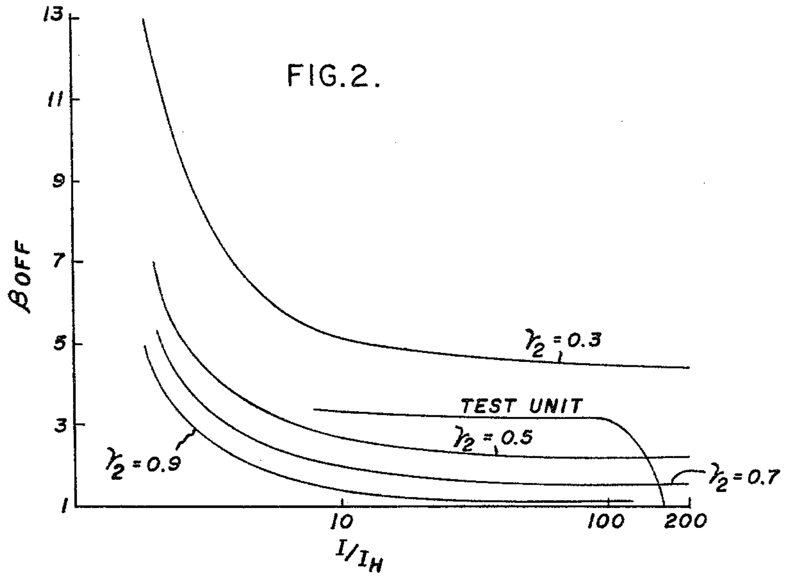
FIGURE 2 is a graph showing calculated and experimental values of turn off gain $\beta_{off}$ plotted along the axis of ordinates against the ratio of device current I to hold current plotted along the axis of abscissas for several values of emitter injection efficiency $\gamma_{E2}$.

One means of restricting one of the $\alpha s$ for example $\alpha_{pnp}$ is to make emitter efficiency $\gamma_{E2}$ of the PNP section low (consider Equation 7). A way to illustrate this effect is shown in FIGURE 2 of the drawings where a calculated value for turn off gain $\beta_{off}$ is plotted along the axis of ordinates as a function of the ratio of device current to holding current, $I/I_H$ (plotted along the axis abscissas for several values of emitter injection efficiency $\gamma_{E2}$). For this purpose, $\alpha_{npn}$ is assumed constant at 0.9. $\alpha_{pnp}$ is assumed to have the form:

(9) $$\alpha_{pnp}=\gamma_{E2}e-I_{O/I}$$

where $I_O$ is the current at which the device turns off. The hold current $I_H$ as obtained for the condition $$\alpha_{npn}+\alpha_{pnp}=1$$

is

(10) $$I_H=\frac{I_O}{1n\left(\frac{\gamma_{E2}}{1-\alpha_{npn}}\right)}$$

so that $$\alpha_{pnp}=\gamma_{E2}\exp\left[\frac{-I_H \ln\left(\frac{E2}{1-\alpha_{npn}}\right)}{I}\right] \quad (11)$$

Notice that the form for $\alpha_{pnp}$ is assumed. This assumption is not accepted generally but it is generally accepted that the $\alpha$ varies roughly exponentially as the currents. The curves illustrate that for high values of injection efficiency $\gamma$, the turn off gains are low. Further, the turn off gain for a given injection efficiency decreases as the current increases but levels off at some substantially minimum value for each emitter injection efficiency.

Among the limitations of this theory is the previously mentioned fact that PNPN switches cannot be accurately described by a one dimensional model except at very low current levels. Further, if enough base current is flowing to effect control, this current results in a voltage (IR) drop which effectively biases off that part of the base adjacent to the gate contact. The current then shifts away from the contact and for a given current, increases current density and probably the $\alpha s$ making the device harder to turn off. Another limitation which is also the result of the base IR drop is that when this voltage (IR) drop exceeds the emitter base breakdown voltage no further control is possible; any increase in gate current is obtained from the emitter and does not affect the load current. How these factors affect device designs may probably best be understood by considering the practical embodiment of FIGURE 3.

Figure 3:
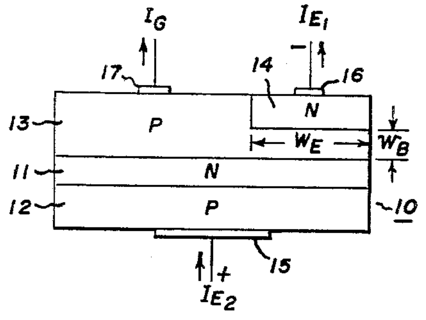
FIGURE 3 is a sectional view which illustrates one particular embodiment of a four layer three terminal semiconductor switch which exhibits the properties of the present invention.

The device illustrated in FIGURE 3 is the unit for which the test data superimposed on FIGURE 2 was taken. As illustrated, the device is made from a single crystal silicon wafer 10 which is doubled doped with aluminum ($2\times10^{17}$) and antimony $(10)^{17}$ so that it is P type. Four layers of different conductivity types are formed in the wafer 10 starting with the original P type lower layer 12 and out diffusing to form the adjacent N type internal layer 11. The internal P type layer 13 and the external N type layer are formed by conventional in-diffusing techniques with gallium and phosphorous respectively. Thus the base N type layer 11 is surrounded by P type layers 12 and 13 which are emitter and P type base regions respectively. The upper P type base region 13 has an N type emitter layer 14 formed in one part of the surface. An anode ohmic contact 15 is formed on the lower P type emitter layer 12, a cathode ohmic contact 16 is formed on the upper N type emitter layer 14 and a gate ohmic contact 17 is formed on the upper surface of the P type base layer 13. It will be recognized that the elements of this device correspond to elements of the schematic of FIGURE 1*a*. In order better to show the correspondence the leads are shown with corresponding currents $I_E$, $I_{E2}$ and $I_G$. In such a device the IR drop will be given by $$IR=I_G\rho_b\frac{W_E}{W_BL} \quad (12)$$

where L is the contact length (contact 17); $\rho_b$ the average base resistivity; $W_B$ the base width (this dimension is truly a thickness—the distance between the upper N type emitter 14 and the internal N type layer 11); and $W_E$ is the emitter width. In this unit $\rho_b$ approximately equals 0.1 ohm centimeter, $W_E$ approximately equals .05 centimeter, $W_B$ approximately equals $2.5\times10^{-4}$ centimeters, L is approximately equal to .05 centimeter. With five milliamperes gate current, the IR drop found from Equation 12 is $$\frac{5(10)^{-3}(.1)(.05)}{2.5(10)^{-4}(.05)}=20\text{ volts}$$

which is slightly greater than the emitter base breakdown voltage. This accounts for the sudden drop in turn off gain at $I_M/I_H=100$ which corresponds in fact to a gate current $I_G$ of about 5 milliamperes. The turn off gain $\beta_{off}$ for this device is found to be 3.3.

Characteristics of the device of FIGURE 3 may be improved considerably if the device is made by other methods, for example, if the original wafer is formed of high resistivity material (1000 ohm centimeter) and the layers formed by conventional triple diffusion techniques.

From the above information it is seen that for best turn off gain the design should be to incorporate a low resistivity, relatively wide base, $W_B$, and a small emitter width $W_E$. The base width $W_B$ should not be so wide as to unduly limit the current gain of the NPN section of the device. Two methods for accomplishing this are shown in FIGURES 4 and 5.

Figure 4:
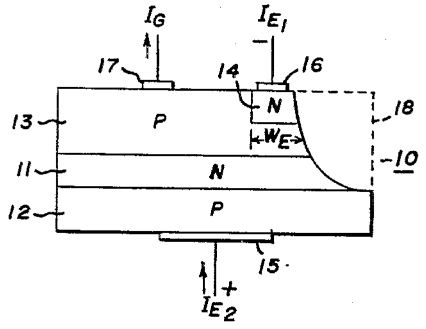
FIGURES 4, 5, 6 and 7 are sectional views which illustrate particular embodiments of four layer three terminal semiconductor switches which have been found to have both turn on and turn off properties.

In FIGURE 4 the semiconductor pellet may be formed essentially as described in connection with the manner suggested for the device of FIGURE 3. Corresponding parts of the two devices are given like reference numerals to simplify both the description and drawings. After forming the PNPN type wafer a portion 18 of the upper side is etched away so that the effective width of the emitter $W_E$ is reduced while the wide base width $W_B$ is maintained. In this manner the IR drop (with the current shifted to the emitter edge away from the gate contact) is reduced (see Equation 12 above). This along with the suppressed current gain ($\alpha$) of the PNP section improves the turn off gain characteristic.

Figure 5:
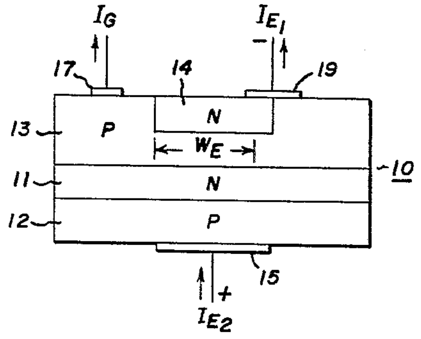

The same general principles are employed in the device of FIGURE 5 but they are accomplished in a different way. In this structure the wafer again is made in the manner described in connection with the preferred way of forming the wafer of FIGURE 3 and again corresponding parts of the device are given corresponding reference numerals. Here, however, the upper N type region 14 is formed in the center of the base P type region 13 and the effective emitter width $W_E$ is made less than the total emitter width by placing a wide shorting cathode contact 19 across the junction between the upper N and P type zones 14 and 13 respectively. The effective emitter width, $W_E$, is reduced due to the effect of shorting contact 19 on the current flow in the device.

Figure 6:
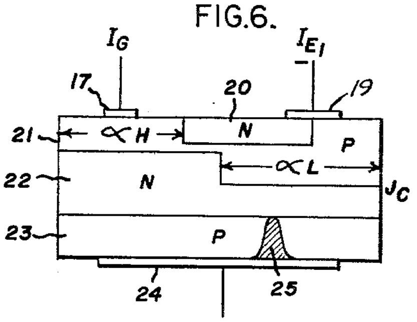

Still another approach to making a structure which exhibits turn off gain (as well as turn on gain) is illustrated in FIGURE 6. This structure may be formed by triple diffusion techniques similar to those suggested for the structure of FIGURE 3. The upper emitter region is the N type region 20. The upper P type base 21 has a thin section (on the left in the drawing) characterized by $\alpha_H$ for high current gain region and a normal thick region characterized by $\alpha_L$ for low current gain region. Next there is a relatively thick N type base 22 which appears just above a P type emitter region 23. The lower emitter 23 has a shorted emitter contact 24 with the short provided by a portion of the contact 25 which extends through the lower P type emitter 23 to the center N type base layer 22. The P type shorted emitter 23 when operative injects holes into the N type base 22. The upper gate and emitter contacts 17 and 19 correspond to those of FIGURE 5 so are given like reference numerals.

If the top shorted emitter 20 is made negative and the bottom one 23 positive, the collector junction, $J_C$ is then in reverse bias prior to switching. A positive current, $I_G$, introduced at the gate contact 17 flows laterally through the upper P type base layer 21 to the upper shorted emitter electrode 19. As this current is increased and the left portion of the upper P type base 21 goes positive the upper region 20 emits heavily near the edge nearest the gate contact 17. Emitted carriers (electrons) traverse the region characterized by $\alpha_H$. Electron current entering and collected in the N type base layer 22 bends to the right towards the shorting portion 25 of the contact 24 and begins to bias the bottom P type emitter 23. As the control gate electrode or contact 17 is driven harder more current flows and ultimately the bottom emitter (layer 23) becomes operative and injects holes toward the $\alpha_H$ region. At this point collector $J_C$ sees an $\alpha$ sum approaching unity and therefore switches.

Turn off is accomplished by driving the gate control electrode 17 with a reverse bias. A field is set up in the P type base 21 which drives electrons on the P side of collector junction $J_C$ into the region of low current gain $\alpha_L$. Hence one $\alpha$ is reduced and, furthermore, electron minority carriers are swept away from the collector junction $J_C$ because of the step in the collector junction. With the current shifted to the right in the FIGURE 6 (as is possible because of the two electrodes on the P type base, control electrode 17 and shorted emitter electrode 16), the bottom shorted emitter 23 is biased by currents traversing a lesser path length. Hence, bias on the lower shorted emitter 23 drops, hole emission drops and both $\alpha s$ are reduced. This sequence of events turn off the device because the sum of $\alpha s$ drops below unity.

Figure 7:
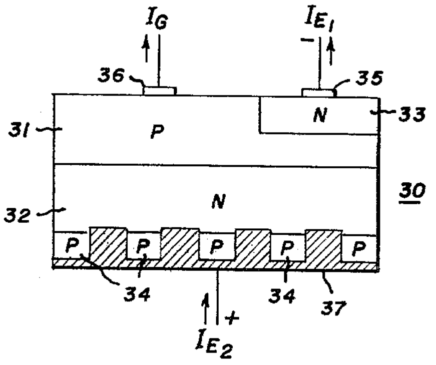

As is indicated in the above discussion, any shorted emitter of the PNP section reduces the injection efficiency of the PNP element and thus supresses and reduces the current gain $\alpha$ of this region so that inherently the $\alpha$ sum cannot rise much beyond unity. Consequently, the shorted emitter for the P type region is a very effective way of apportioning the current gains to obtain good turn off gain. A particularly good structure is illustrated in FIGURE 7. Here again the pellet of wafer 30 may be formed from an N type material by conventional triple diffusion techniques. A P type base layer 31 is formed next to the N type base 32, and an N type emitter layer 33 is formed in the P type base layer 31 much as the structure described in connection with FIGURE 3. However, in this structure a plurality of P type regions 34 are diffused into the N type region 32. An ohmic contact 35 forms the device cathode contact on the upper N type region 33, a gate contact 36 is placed on the upper P type base region 31 and a shorted emitter contact 37 is provided on the lower surface of the device so that it shorts the P type emitter regions 34 and the N type base region 32. Thus the PNP emitter efficiency is extremely low and the current gain $\alpha_{pnp}$ is reduced to a very low value. Until a sufficiently high current is collected the structure acts as a conventional NPN transistor. However, at high enough current levels, the P type regions 34 in the collector 32 are biased sufficiently to give some emission. This gives an $\alpha$ seemingly arising from the collector contact 37. This $\alpha$ plus the regular transistor $\alpha$ will approach unity at some sufficiently high current (collector current) and the device switches on.

The device exhibits turn off gain by virtue of the fact that the $\alpha$ of the PNP section is such that the device cannot sustain a holding current when the gate contact 36 is biased negatively.

It is obvious that many devices related to these may be proposed. While particular embodiments of the invention have been shown and described, it will of course be understood that the invention is not limited thereto since many modifications vary to fit particular operating requirements and environments will be apparent to those skilled in the art. Accordingly the invention is not considered limited to the examples chosen for the purposes of the disclosure and it is contemplated that the appended claims will cover any such modifications as fall within the true spirit and scope of the invention.

What we claim as new and desire to secure by Letters Patent of the United States is:

1. A PNPN semiconductor triode switch comprising a semiconductor body including a body having four layers arranged in succession, contiguous layers being of opposite conductivity type, a pair of individual low resistance ohmic connections to one terminal layer and to the adjacent intermediate layer respectively, the opposite terminal layer comprising more than one essentially discrete region of one type conductivity and low resistance contact means in contact with at least a surface of each of said discrete regions and an exposed surface of the adjacent intermediate layer, the maximum effective current gain of the first three contiguous layers including said opposite terminal layer having a very low value and the other three contiguous layers having a maximum effective current gain less than unity but much greater than said first three layers whereby the sum of said current gains approach unity.

2. In a semiconductor switch a semiconductor body including a body having four layers arranged in succession, contiguous layers being of opposite conductivity type, a pair of individual low resistance ohmic connections to one terminal layer and to the adjacent intermediate layer respectively, the opposite terminal layer comprising more than one essentially discrete region of one type conductivity and low resistance contact means in contact with at least a surface of each of said discrete regions and an exposed surface of the adjacent intermediate layer, the maximum effective current gain of the first three contiguous layers including said opposite terminal layer having a very low value and the other three contiguous layers having a maximum effective current gain less than unity but near an order of magnitude greater than said first three layers whereby the sum of said current gains approach unity.

3. In combination in a semiconductor switch, a body of semiconductor material having four layers of alternate conductivity type separated by three junctions, the center one of said junctions having a displacement whereby its distance varies from the planes of the other two junctions in a region which is between the said other two junctions, low resistance connections to each terminal layer and one of said intermediate layers, the said connection to the terminal layer adjacent the contacted intermediate layer positioned adjacent to the edge of said terminal layer furtherest removed from said center junction and from the contact to said intermediate layer.

4. A semiconductor PNPN triode switch including in combination a body of semiconductor material having four layers of alternate conductivity type separated by three junctions, the center one of said junctions having a displacement whereby its distance varies from the planes of the other two junctions in a region which is between the said other two junctions, low resistance connections to each terminal layer and one of said intermediate layers, the said connection to the terminal layer adjacent the contacted intermediate layer positioned adjacent the edge of said terminal layer furtherest removed from said center junction and from the contact to said intermediate layer, said connection to the opposite terminal layer also contacting a portion of the adjacent intermediate layer.

5. In a semiconductor switch, the combination of a body of semiconductor material having four layers of alternate conductivity type separated by three junctions, the center one of said junctions having a displacement whereby its distance varies from the planes of the other two junctions in a region which is between the said other two junctions, low resistance connections to each terminal layer and one of said intermediate layers, the said connection to the terminal layer adjacent the contacted intermediate layer also contacting said intermediate layer and positioned adjacent the edge of said terminal layer furtherest removed from said center junction and from the contact to said intermediate layer.

6. In combination in a semiconductor switch a body of a semiconductor material having four layers of alternate conductivity type separated by three junctions the center one of said junctions having a displacement whereby its distance varies from the planes of the other two junctions in a region which is between the said other two junctions, low resistance connections to each terminal layer and one of said intermediate layers, the said connection to the terminal layer adjacent the contacted intermediate layer also contacting said intermediate layer and positioned adjacent the edge of said terminal layer furtherest removed from said center junction and from the contact to said intermediate layer, said connection to the opposite terminal layer also contacting a portion of the adjacent intermediate layer.

7. A semiconductor switch including a body of semiconductor material having four layers of alternate conductivity type separated by three junctions low resistance ohmic connections to each terminal layer and one of said intermediate layers, the said connection to the terminal layer adjacent the contacted intermediate layer also contacting said intermediate layer and positioned adjacent an edge of said intermediate layer remote from the contact to said intermediate layer, the maximum effective current gain of a first three contiguous layers including the contacted intermediate layer as one end layer having a very low value and the other three contiguous layers having a maximum effective current gain of less than unity but much greater than said first three contiguous layers whereby the sum of said current gains approach unity.

8. A semiconductor switch including a body of semiconductor material having four layers of alternate conductivity type separated by three junctions, low resistance connections to each terminal layer and one of said intermediate layers, the said connection to the terminal layer adjacent the contacted intermediate layer also contacting said intermediate layer and positioned adjacent an edge of said intermediate layer remote from the contact to said intermediate layer, the maximum effective current gain of a first three contiguous layers including the contacted intermediate layer as one end layer having a very low value and other three contiguous layers having a maximum effective current gain of less than unity but near an order of magnitude greater than said first three contiguous layers whereby the sum of said current gains approach unit.

9. A PNPN semiconductor triode switch including a semiconductor body having four layers arranged in succession, contiguous layers being of opposite conductivity type, a pair of individual low resistance ohmic connections to one terminal layer and to the adjacent intermediate layer respectively, the opposite terminal layer comprising a plurality of essentially discrete regions of one type conductivity and low resistance contact means in contact with at least a surface of each of said discrete regions and an exposed surface of the adjacent intermediate layer, the maximum effective current gain of the first three contiguous layers including said opposite terminal layer having a very low value and the other three contiguous layers having a maximum effective current gain less than unity but much greater than said first three layers whereby the sum of said current gains approach unity.

10. In combination in a semiconductor switch, a body of semiconductor material having four layers of alternate conductivity type separated by three junctions, the center one of said junctions having a displacement whereby its distance varies from the planes of the other two junctions in a region which is between the said other two junctions, low resistance connections to each terminal layer and one of said intermediate layers, the said connection to the terminal layer adjacent the contacted intermediate layer positioned adjacent to the edge of said terminal layer furtherest removed from said center junction and from the contact to said intermediate layer, the maximum effective current gain of a first three contiguous layers including the said terminal layer adjacent the said contacted intermediate layer having a maximum effective current gain less than but approaching unity, the effective current gain of the three contiguous layers including the opposite terminal layer having a maximum current gain much lower than the said first three layers whereby the sum of said current gains approach unity.

References Cited by the Examiner

UNITED STATES PATENTS

| | | | |
|---|---|---|---|
| 2,877,359 | 3/1959 | Ross | 317—234 |
| 2,959,504 | 11/1960 | Ross et al. | 317—235 |
| 2,971,139 | 2/1961 | Noyce | 317—235 |
| 2,989,426 | 6/1961 | Rutz | 317—235 |
| 2,993,154 | 7/1961 | Goldey et al. | 317—235 |
| 3,078,196 | 2/1963 | Ross | 317—235 |
| 3,097,336 | 7/1963 | Sziklai | 317—235 |
| 3,124,703 | 3/1964 | Sylvan | 317—235 X |

DAVID J. GALVIN, *Primary Examiner.*

JAMES D. KALLAM, JOHN W. HUCKERT, *Examiners.*